United States Patent
Cummings et al.

(10) Patent No.: US 11,953,547 B2
(45) Date of Patent: Apr. 9, 2024

(54) DATA RECORDER

(71) Applicant: BAE Systems Controls Inc., Endicott, NY (US)

(72) Inventors: Thomas J. Cummings, Endwell, NY (US); Robert J. Vovos, Vestal, NY (US)

(73) Assignee: BAE Systems Controls Inc., Endicott, NY (US)

( * ) Notice: Subject to any disclaimer, the term of this patent is extended or adjusted under 35 U.S.C. 154(b) by 293 days.

(21) Appl. No.: 17/560,998

(22) Filed: Dec. 23, 2021

(65) Prior Publication Data

US 2023/0204665 A1    Jun. 29, 2023

(51) Int. Cl.
*G01R 31/3185*    (2006.01)
*G01R 31/319*    (2006.01)

(52) U.S. Cl.
CPC . *G01R 31/31853* (2013.01); *G01R 31/31905* (2013.01); *G01R 31/31915* (2013.01)

(58) Field of Classification Search
CPC ........ G01R 31/31853; G01R 31/31905; G01R 31/31915
See application file for complete search history.

(56) References Cited

PUBLICATIONS

Sorokin, A.V., "Instrument-to-PC Interfacing Using an Enhanced Parallel Port", 2002, Instruments and Experimental Techniques, vol. 45, No. 4, pp. 516-520. (Year: 2002).*
Emilio, Maurizio Di Paolo, "Embedded Systems Design for High-Speed Data Acquisition and Control", 2015, Springer International Publishing, pp. 33-48 (Year: 2015).*
Oyetoke, Oluwole O., "A Practical Application of ARM Cortex-M3 Processor Core in Embedded System Engineering", Jul. 2017, I.J. Intelligent Systems and Applications, 2017, 7, pp. 70-88 (Year: 2017).*

* cited by examiner

*Primary Examiner* — Henry Tsai
*Assistant Examiner* — John B Roche
(74) *Attorney, Agent, or Firm* — Scully Scott Murphy & Presser PC

(57) ABSTRACT

An apparatus that allows for access to any and all registers of a central processing unit in a line replaceable unit (LRU) without a need to open the housing of the LRU is provided. The apparatus may receive write or read packets from an external device and relay the same to an LRU. The apparatus may receive state information from one or more registers of the LRU in response. The apparatus may transmit or transfer the state information to an external device. The apparatus may be used to update firmware in the LRU, for diagnostics or testing.

18 Claims, 8 Drawing Sheets

300

DATA RECORDER

FIELD OF THE DISCLOSURE

This disclosure relates to a diagnostic, testing and updating device for a unit under testing (UUT). More particularly, this disclosure relates to a device which can receive and transmit data associated with one or more registers in a central processing unit (CPU), such as a field programmable gate array (FPGA), via a fiber optic cable.

BACKGROUND

Power systems typically have either a power converter or a power inverter. The converter or inverter may have one or more central processing units (CPUs) in a housing such as in a line replaceable unit (LRU). The CPU typically comprises a plurality of registers. There are various types of CPUs including Microcontrollers, Microprocessors, Application Specific Integrated Circuits (ASIC) and Field programmable Gate Array (FPGA). In order to assess the data in the register for testing or diagnostics, a technician may open the housing of the converter or inverter and directly connect a diagnostic device to a circuit board holding the CPU. This requires special tools to open the housing in order to test the CPU. It may also be difficult to access the LRU, require bringing the LRU out of operation and/or require a specific technician to be able to conduct the testing.

There also may be a need to get access to the data in the registers in real time such as at a speed of 1 GHz or greater to get real-unaliased data from the registers. The high speed access may require special wires or cables and hardware to be included within the LRU. This increases the cost for the LRU.

SUMMARY

Accordingly, disclosed is an apparatus that allows for access to any and all registers of a CPU in a line replaceable unit (LRU) without a need to open the housing of the LRU. The apparatus is able to transmit and receive data to/from the registers of the CPU in the LRU in real-time.

Accordingly, disclosed is an apparatus which may comprise a small-form factor connector, a control area network (CAN) interface or a universal serial bus (USB) interface and a processor. The apparatus may be connectable to a unit under testing (UUT) via a fiber optic cable connectable to the small-form factor connector. The apparatus may be connectable to an external device via at least one of the CAN interface or the USB interface. The processor may be configured to receive a plurality of register addresses for registers such as in a Field Programmable Gate Array (FPGA) in the UUT from the external device via at least one of the CAN interface or USB interface to set up a reading of the corresponding registers in the FPGA, relay the plurality of register addresses to the FPGA via the fiber optic cable and receiving state information corresponding to each of the plurality of register address periodically. The period may be less than or equal to an analog to digital conversion of an analog to digital converter (ADC) in the UUT. For example, the period may be less than 650 ns.

In an aspect of the disclosure, the processor in the apparatus may be field programmable gate array (FPGA) with a gigabit interface, other examples of CPUs may be used.

In an aspect of the disclosure, the apparatus may further comprise a plurality of digital-to analog converters (DACs) coupled to the processor and a plurality of analog output interfaces. One analog output interface may be connected to a corresponding one of the plurality of DACs, respectively. Each of the plurality of analog output interfaces may be configured to be connectable to a second external device.

In an aspect of the disclosure, the processor may be configured to cause the state information corresponding to at least a subset of the plurality of register addresses to be output to the second external device via the analog output interface(s) in response to receipt of the subset of the plurality of register addresses from the external device.

In an aspect of the disclosure, the firmware for the UUT may be updated via the apparatus. In this aspect of the disclosure, the processor may be configured to receive a firmware update for the UUT from the external device via at least one of the CAN interface or USB interface, and relay the firmware update to the UUT via the fiber optic cable to write the firmware update to one or more registers. The firmware update may be associated with one or more register addresses.

In an aspect of the disclosure, certain registers in the UUT may be written to via the apparatus. In this aspect of the disclosure, the processor may be configured to receive a write command for one or more registers of the CPU in the UUT from the external device via at least one of the CAN interface or USB interface and relay the write command to the UUT via the fiber optic cable to write to the one or more registers based on addresses.

In an aspect of the disclosure, the apparatus may further comprise an input analog interface; and an analog to digital converter (ADC). The ADC may be connected to the processor. The input analog interface may be configured to be connected with the external device.

In an aspect of the disclosure, the apparatus may be configured to receive at least one target analog signal from the external device, convert the at least one target analog signal into at least one target digital signal and transmit the at least one target digital signal to the CPU in the UUT via the fiber optic cable. The at least one target analog signal may be associated with one or more register addresses in the CPU in the UUT.

In an aspect of the disclosure, the at least one target analog signal may be obtained from known application data. The known application data may be reference driving route and contains at least one of injected torque, current or voltage from the reference driving route and corresponding register addresses.

In an aspect of the disclosure, the at least one target analog signal may be obtained from a function generator in the external device.

In an aspect of the disclosure, the external device may be a spectrum analyzer. The at least one target analog signal may be a frequency spectrum for examining a frequency response or stability analysis.

In an aspect of the disclosure, the processor may be configured to receive a packet from the external device. The packet may include the plurality of register addresses for registers in the CPU in the UUT. The packet may further include a header. The processor may determine to relay the plurality of register addresses by examining a destination in the header.

In an aspect of the disclosure, the apparatus may further comprise a memory card connector. The apparatus may be further configured to transmit the state information to a memory card connected to the memory card connector.

In other aspects of the disclosure, disclosed is an apparatus which may comprise a small-form factor connector, an input analog interface, an analog to digital converter (ADC) and a processor. The apparatus may be connectable to a unit under testing (UUT) via a fiber optic cable connectable to the small-form factor connector. The input analog interface may be configured to connect with an external device. The processor may connect to the ADC. The apparatus may be configured to receive at least one target analog signal from the external device via the input analog interface and convert the at least one target analog signal into at least one target digital signal, respectively. The processor may be configured to transmit the target digital signal to central processing unit, such as a field programmable gate array (FPGA) in the UUT via the fiber optic cable and receive state information from the one or more register addresses, periodically. The at least one target analog signal may be associated with one or more register addresses in the CPU in the UUT. The period may be less than or equal to an analog to digital conversion of an analog to digital converter (ADC) in the UUT.

Also disclosed is a diagnostic kit. The diagnostic kit may comprise a fiber optic cable and mobile device. The mobile device may comprise a housing. The housing may comprise a small-form factor connector, and a control area network (CAN) interface or a universal serial bus (USB) interface. The small-form factor connector may be configured to receive the fiber optic cable. The fiber optic cable may be connectable to a port in a housing of a unit under testing (UUT). The mobile device may be connectable to an external device via at least one of the CAN interface or USB interface. The mobile device may comprise a processor. The processor may be configured to receive a plurality of register addresses for registers in a central processing unit, such as a field programmable gate array (FPGA) in the UUT from the external device via at least one of the CAN interface or USB interface to set up a reading of the corresponding registers in the UUT, relay the plurality of register addresses to the CPU in the UUT via the fiber optic cable, and receive state information corresponding to each of the plurality of register address periodically. The period may be less than or equal to an analog to digital conversion of an analog to digital converter (ADC) in the UUT.

DETAILED DESCRIPTION

In accordance with aspects of the disclosure, a device 1 also referred to as "a data recorder" can transmit read and/or write commands to a line replaceable unit (LRU) for specific registers in a central processing unit (CPU) (also referred to a system controller or processor), of the LRU via a high speed communication. The CPU may be, but is not limited to Microcontrollers, Microprocessors, Application Specific Integrated Circuits (ASIC) and an Field Programmable gate array (FPGA). The device 1 may also receive state information, e.g., value(s), read from the registers in response to the read command also via a high speed communication. As such the device 1 enables real-time access to every single register of the CPU in the LRU without a need to open a housing of the LRU to directly plug into the CPU.

The device 1 provides a high speed and a low cost diagnostics tool that can be used in a laboratory, production or field testing.

In an aspect of the disclosure, the device 1 is portable.

Figure 1:
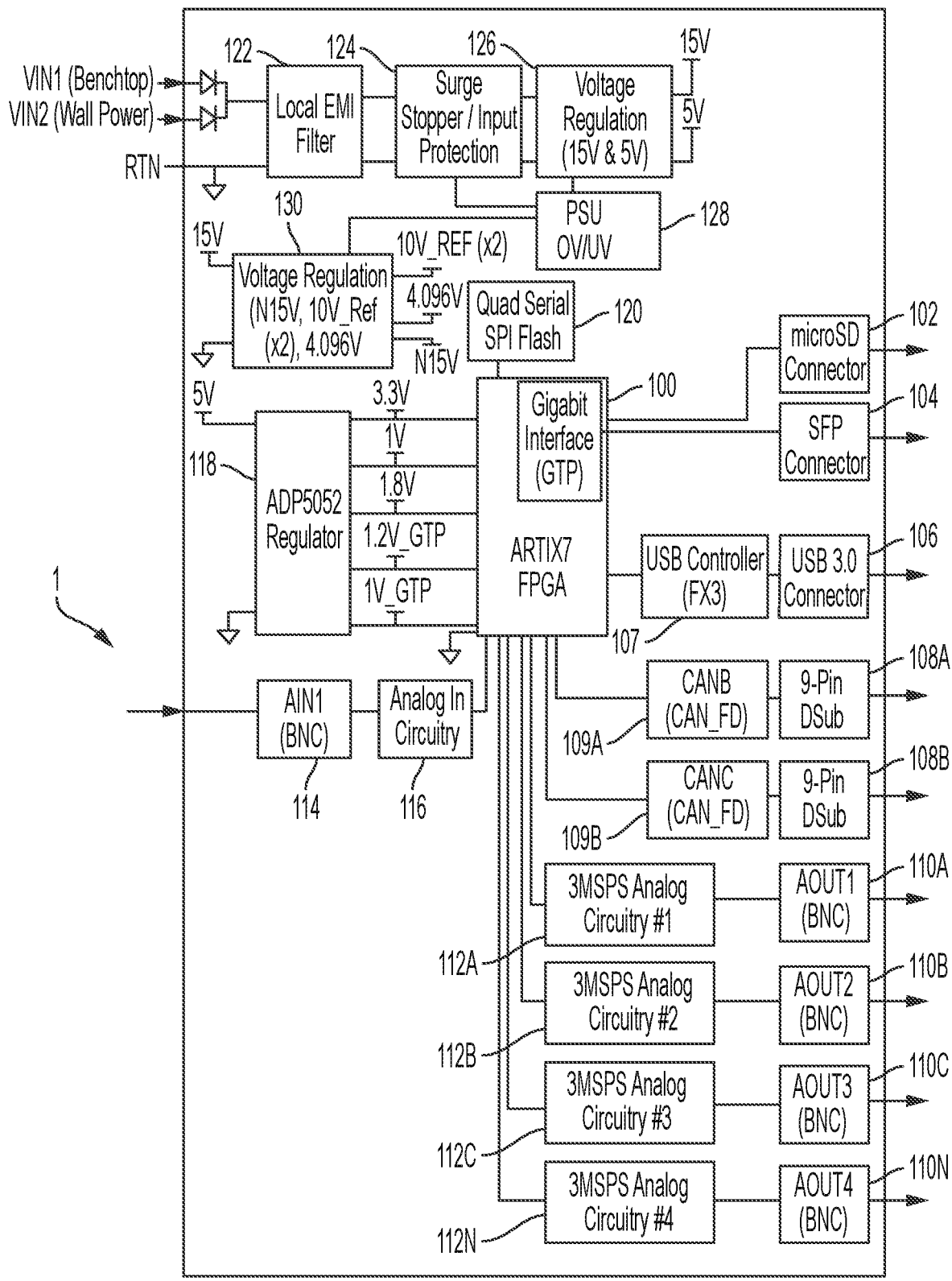
FIG. 1 is a block diagram of a data recorder in accordance with aspects of the disclosure.

FIG. 1 depicts a block diagram of the device 1. The device 100 may include a processor such as an FPGA 100 (or another type of a CPU). The FPGA 100 may be programmed to execute the functionality described herein. The FPGA 100 may be a 7 series FPGA available from Xilinx. In an aspect of the disclosure, the FPGA 100 may have a high speed interface. The high speed interface may be a gigabit interface. The interface may be configured for GPRS Tunnelling protocol (GTP).

The device 1 may be connected to the LRU (also referred to herein as unit under testing (UUT) via a fiber optic cable. The fiber optic cable may be connected to a small form-factor pluggable (SFP) connector 104. SFP connector 104 comprises a transceiver that is hot-swappable and used in data communication and telecommunication networks (I/O transceiver). The SFP connector 104 may be on the housing of the device 1 or accessible through the housing. The SFP connector 104 may have a communication speed of 1.25 Gbps. The SFP connector 104 may be a modular slot for the fiber-optic cable. The SFP connector 104 is connected to the interface in the FPGA 100.

Data read from the registers of the CPU in the UUT 205 may be internally stored in the device 1. For example, the device 1 may have memory such as flash memory 120. In an aspect of the disclosure, the flash memory 120 may be a Quad Serial SPI flash. In other aspects of the disclosure, different types of internal memory may be used.

The signals (such as the read or write commands or stimulus) received from other external devices may be also stored in the flash memory 120. Other external devices may be a personal computer, mobile phone, tablet, laptop, spectrum analyzer, etc.

In other aspects of the disclosure, in additional to or alternatively, data may be stored in an external device such as a memory card connected to the device 1 via a micro SD connector 102.

The device 1 may also include one or more universal serial bus (USB) connectors 106. In FIG. 1 only one USB connector 106 is shown for illustrative purposes, however more than one may be included. The USB connector 106 may be on the housing of the device 1 or accessible through the housing. As depicted, the USB is a USB 3.0 connector. But, the USB connector 106 is not limited to USB 3.0 and any generation of USB may be used. The connector 106 may include USB-C or micro-USB connectors.

The device 1 may comprise a USB controller 107 connected to the USB connector(s) 106 and the FPGA 100. The USB controller 107 packs and unpacks data from the USB 3.0 connector for use by the FPGA 100 or an external device. In some aspects of the disclosure, an external device may be connected to the USB connector 106 to transmit write and/or read commands to the device 1 (and/or for the device 1 to relay to the UUT 205). The write/read commands (or input stimulus) may be included in a packet.

The device 1 may also include one or more Controller Area Network (CAN) interfaces. The CAN interfaces may also be on the housing or accessible through the housing. The CAN interface may comprise connectors such as a 9-pin D-subminiature (D-sub)) port 108A and 108B. The device 1 may have a CAN interface for different CAN protocols such as CANB 109A and CANC 109B. In some aspects of the disclosure, the CAN supports flexible data-rate (FD). In other aspects, the CAN may be classical CAN. CANB 109A and CANC 109B includes circuits containing CAN controllers and transceiver integrated circuits. The CAN controllers translates serial data on the CAN bus to and from data in the FPGA 100. The CAN controllers are responsible for following the CAN bus protocol. The CAN transceiver physically translates single ended CMOS level signals from the CAN controller to CAN bus level differential level signals.

CANB 109A and CANC 109B are connected to the FPGA 100. CANB 109A and CANC 109C refer to two different CAN connections. In some aspects of the disclosure, an external device may be connected to the D-Sub 108A and 108B to transmit write and/or read commands to the device 1 (and/or for the device 1 to relay or transmit to the UUT).

In an aspect of the disclosure, the device 1 may have a plurality of analog output ports (connectors). The ports (connectors) may be BNC connectors 110A-110N. Four output ports are shown in FIG. 1. However, the number of ports (connectors) is not limited to four and any number of ports may be used. The number of ports may be based on the size of the device 1 (target size). BNC connectors 110A-110N may also be on the housing or accessible through the housing.

Each output port (connector) may be respectively connected to a digital-to-analog conversion circuit 112(A-N). The digital-to analog conversion circuit 112A-112N converts the digital signal received from the FPGA 100 into an analog signal for transmission to an external device such as oscilloscope 215 or a spectrum analyzer 700. The sampling rate may be at least 3 (megasamples per second). In an aspect of the disclosure, an oscilloscope or a spectrum analyzer may be connected to one or more output ports (BNC connectors) 110A-110N. The oscilloscope 215 or spectrum analyzer 700 may display the analog signal corresponding to read values from the registers in the CPU in the UUT 205. In this aspect of the disclosure, data read from one register may be transmitted from the device 1 to oscilloscope 215 or a spectrum analyzer 700 via one of the output ports (BNC connectors) 110A-110N. Therefore, if there are four output ports, then data read from four different registers may be transmitted from the device 1 to the oscilloscope 215 or a spectrum analyzer 700 at a given time. An operator can thus view the analog signals and troubleshoot errors or otherwise record the results. The analog signals can also be stored and played back at a later time.

In an aspect of the disclosure, the device 1 may have a plurality of analog inputs 114. In FIG. 1 only 1 analog input is shown. However, the number of inputs (connectors) is not limited to one and any number of inputs may be used. The analog input 114 may be connected to an analog-to-digital conversion (ADC) circuit 116. The ADC circuit 116 may convert the input analog signal(s) into digital signals input into the FPGA 100.

In an aspect of the disclosure, an external device may be connected to the analog input 114 to supply an analog signal(s) (stimulus) to the device 1 to transmit to one or more registers in the CPU in the UUT 205 (write). The analog signals (stimulus) may be used for diagnostics such as stability analysis and Bode plots. In other aspects, the analog signal(s)(stimulus) may be control signals such as information from a preset or known application data. In some aspects, the data may be a reference driving route and contains at least one of injected torque, current or voltage from the reference driving route and corresponding register addresses.

The device 1 may be powered by an external power source. The external power source may be AC. The external power source may be a benchtop power source if in a laboratory or production facility. In other aspects, the external power source may be an electrical grid such as wall power. In other aspects of the disclosure, the external power source may be a portable AC generator. The device 1 may have one or more input power connectors. In FIG. 1, two input power connectors are shown (one for benchtop and one for wall). The AC power received is rectified into DC. The rectified DC rail is filtered by an EMI filter 122. The EMI filter 122 may be an LC filter. The device 1 may also have surge protection (Surge Stopper/Input protection) 124. The surge stopper may be a fuse and/or a switch. The surge protection may also include an inrush limitor. For example, a resistance circuit may be placed in parallel with the switch(es) to prevent surge. The resistance may be provided by an NTC thermistor.

The device 1 may include one or more voltage regulation devices 126, 130. A first voltage regulation device 126 may provide two outputs, e.g., two DC voltage rails. For example, the voltage regulation device 126 may provide 15V and 5V. These voltage regulation devices provide various power inputs to run the FPGA 100, analog circuits 112A-112N, 116 and other elements of the device 1. 15V and 5V are provided only as an example, and the specific voltage level and number of regulation device(s) may change for a given application, implementation or different circuit components such as a different processor.

The 15V may be input to the second voltage regulation device 130. The 5V may be input to a regulator 118. The regulator 118 may be a buck regulator and LDO regulator. Regulator 118 supply voltages needed for the FPGA 100 including for the gigabit interface. As shown in FIG. 1, regulator 118 has 5-channels. Two of the channels may be used for the gigabit interface in the FPGA 100. The device may further comprise an Overvoltage (OV) and undervoltage (UV) 128 detection circuit. The PSU OV/UV 128 circuit detects over voltage and undervoltage of all of the power supply rails on the device 1. If any of the voltage rails becomes too high or too low in voltage, the device 1 is temporarily reset. This circuit ensures that the device 1 is not damaged by inappropriate power supply behavior but also ensures that all digital devices are operating in the same manner because the voltages being provided to them are insured to be in the range of what the IC digital devices were designed and tested to.

Figure 2:
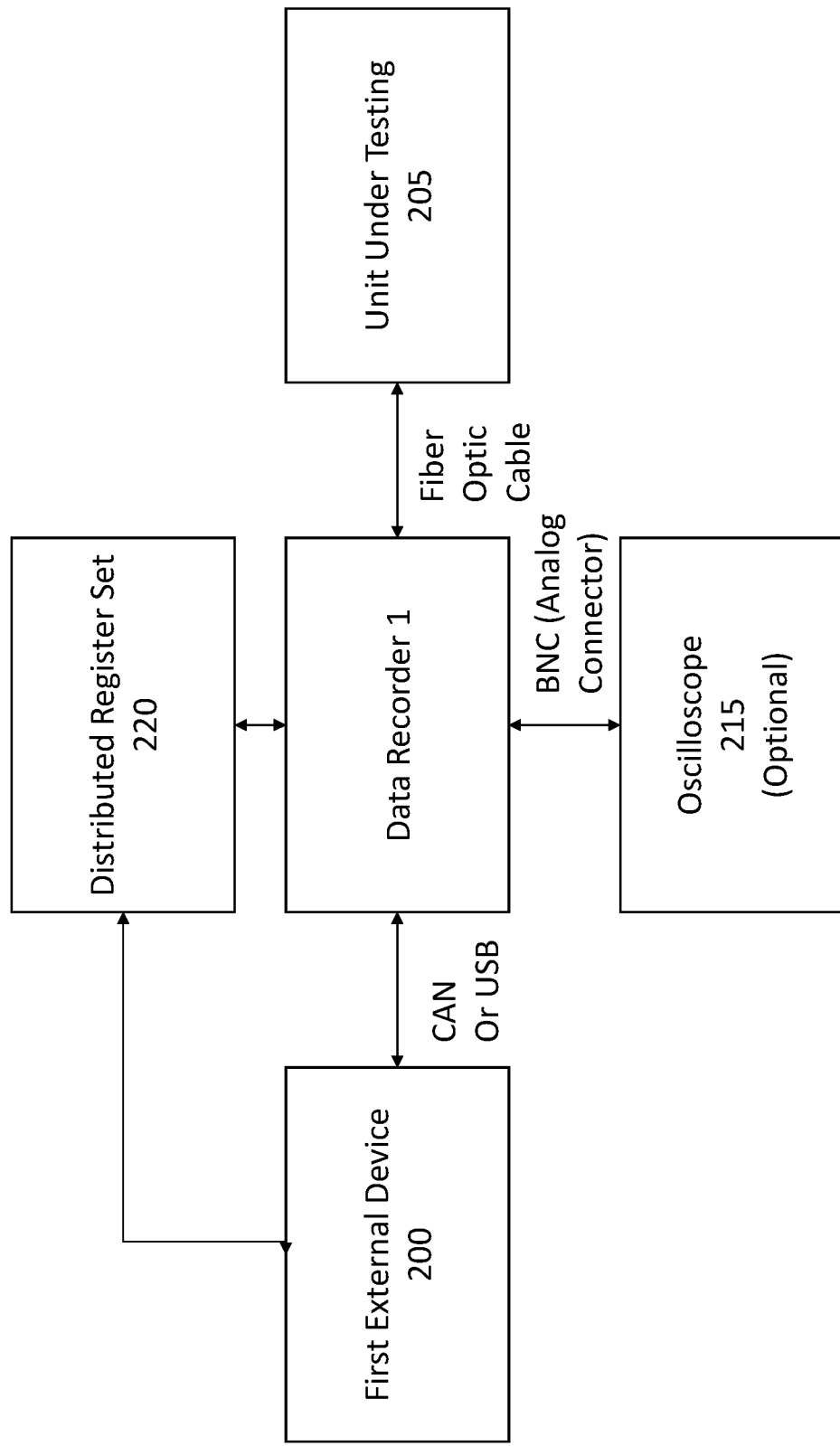
FIG. 2 is a diagram of a diagnostics, testing and updating system in accordance with aspects of the disclosure for a unit under testing.

FIG. 2 is a diagram of a diagnostics, testing and updating system in accordance with aspects of the disclosure for a unit under testing 205. The system may comprise the device 1 (data recorder) described above, a first external device 200, the UUT 205 and a distributed register set 220.

The UUT 205 may be a LRU and comprises a CPU, such as listed above, with registers. In an aspect of the disclosure, the UUT 205 may be a power device such as a power converter or inverter. The power device may be for and/or installed in a vehicle such as an electric vehicle or a hybrid electric vehicle. The hybrid electric vehicle may be a series or parallel hybrid electric vehicle. The vehicle may be a car, bus, taxi, vessel, airplane, UAV, UUV, train, tank, truck, or helicopter. The UUT 205 may be connected to the device 1 via the fiber optic cable. The fiber optic cable is connected to the SFP connector 104 in the device 1 on one end and the other end is connected to a connector in the housing in the UUT 205. This way, the UUT 205 does not need to be opened. The UUT 205 may also be connected to upstream and downstream components in the vehicle.

In an aspect of the disclosure, the first external device 200 may be connected to the USB connector 106 or CAN interfaces 108A or 108B. The first external device 200 may be a personal computer, mobile phone, tablet, laptop.

The first external device 200 may be used for diagnostics and testing in the UUT 205 by transmitting a read command to read data in one or more registers of the CPU in the UUT 205 in the form of a packet to the device 1 (which may relay the packet) to the UUT 205. In an aspect of the disclosure, the read command may set up a diagnostics channel between the UUT 205 and the device 1 such that each time the register is updated, the UUT 205 transmits the state information to the device 1. In an aspect of the disclosure, the UUT 205 has an update rate defined by the analog-to-digital conversion rate of conversion circuitry in the UUT 205. The analog-to-digital conversion rate may be 650 ns. Thus, in accordance with this aspect of the disclosure, the device 1 may receive state information from the UUT 205 for a specific register every 650 ns. In other aspects of the distance, the read command may cause the UUT 205 to transmit the instantaneous state information for the register.

In other aspects of the disclosure, the first external device 200 may be used to write information to one or more registers in the CPU in the UUT 205. For example, the first external device 200 may update the firmware in the CPU, such as in an FPGA, in the UUT 205 by writing new firmware to each register. In other aspects of the disclosure, the first external device 200 may control the CPU in the UUT 205 by writing to one or more registers in the CPU in the UUT 205 control information as part of diagnostics and testing. In this aspect of the disclosure, the first external device 200 may monitor the response by reading other registers in the CPU in the UUT 205 which state information changes based on the written control information.

The system may further include a distributed register set 220. In an aspect of the disclosure, the distributed register set 200 comprises a table having a list of addresses of the registers of the CPU in the UUT 220. The list also comprises the corresponding function or type of state information associated with the address. The distributed register set 200 may be used to determine which registers to read or write. The distributed register set 200 may be assess by the first external device 200 and the device 1. The distributed register set 220 may be stored in a memory with mapped set of register. The information in the memory mapped registers may be access by providing addresses through the various interfaces in the device 1. In an aspect of the disclosure, the distributed register set 220 is stored in the UUT 205, such as part of the CPU in the UUT 205.

The system may optionally comprise an oscilloscope 215. The oscilloscope 215 may be used to view the analog signals representing the state information from the register(s) of the CPU in the UUT 205. The oscilloscope 215 may be connected to one or more output ports (BNC connectors) 110A-N of the device 1.

In an aspect of the disclosure, the system may be used to read state information from the registers and/or write information to the registers in the CPU in the UUT 205 in the field. For example, the system may be used when a vehicle is disabled in a route. When in the field, a user may use the device 1, a fiber optic cable and the first external device to run diagnostics and test the UUT 205. In other aspects of the disclosure, the read/write commands may be prestored in the device 1 and the user may use the device 1 and a fiber optic cable (without the need to bring the first external device 200 to the site). In an aspect of the disclosure, since the state information read from the registers of the CPU in the UUT 205 may be internally stored in the device 1, the oscilloscope 215 does not need to be brought to the field state. Rather, after the state information is recorded into the device 1, the device 1 may be subsequently connected to the oscilloscope 215 for playback.

The first external device 200 may cause the UUT 205 to read state information from one or more registers (via the device 1) and/or write information (such as update firmware or control information) to one or more registers (via the device 1) by transmitting/relaying a packet to the device 1.

Figure 3:
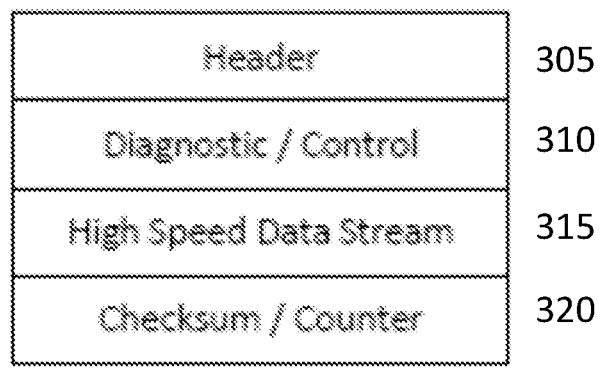
FIG. 3 is a diagram of a packet in accordance with aspects of the disclosure.

FIG. 3 illustrates an example of the format of the packet 300. Packet 300 is a low latency packet, which provides real time access to the registers. The packet 300 comprises a header 305, diagnostic/control 310, high speed data stream 315 and checksum/counter 320. The header 305 comprises the destination and source of the packet. The destination being an address of the final destination of the packet 300, the source being an address of the source of the packet 300. In an aspect of the disclosure, the address may be the IP address. In other aspects of the disclosure, the address may be the MAC address. Diagnostic/control 310 is an identifier of the function of the packet 300. For example, if the packet 300 is for reading state information from one or more registers of the CPU in the UUT 205, the identifier may indicate that the packet is diagnostic. In other aspects, if the packet 300 is for writing information to one or more registers or updating firmware, control may include a corresponding identifier indicating the same.

High speed data stream 315 may depend on whether the packet 300 is for reading state information or writing information or firmware updates. When the packet 300 is for reading state information, the high speed data stream 315 may include the addresses of one or more registers of the CPU in the UUT 205. When the packet 300 is for writing information and/or updating the firmware, the high speed data stream 315 may include the address of one or more registers of the CPU in the UUT 205 and corresponding information or updated firmware.

In an aspect of the disclosure, two different packets may be transmitted: one for writing to registers in the CPU in the UUT 205 and a second for reading state information which is changed in response to the updated firmware or information written.

When a packet 300 is used for reading state information, the packet may include the address(es) of the register(s) for reading and blank data. In response, the device 1 (FPFA 100) receives from the UUT 205 a packet having the same address(es) and the state information, respectively. When a packet is used for writing information or firmware, the packet may include the address(es) for writing and the information to write. In response, the device 1 (FPFA 100) receives from the UUT 205 a packet having the same address(es) and confirmation that the writing took place.

Checksum/counter 320 may be used for error detection and tracking. In an aspect of the disclosure, the counter may be used to ensure that no packets 300 were missed, e.g., transmission failure. Each packet 300 may include a counter. The counter may be used to make sure that there is no stale data. For example, the counter may go 1, 2, 3, 4, 1, 2, 3, 4, ... etc. The above description of the counter is just by way of example and other counter values may be used. The actual value of the counter may depend on the number of bits reserved for use as a counter. However, the values should be large enough to identify missing packets.

If within a period of time, the counter in a packet received does not change or a value of the counter skips, packets are getting lost. For example, if two consecutive received packets have a value of the counter as 2 and 4 or 2 and 1, certain packets were not received.

The checksum may be used to confirm that packet is authentic and not corrupted. The checksum verifies the individual message bits in the packet 300. For example, the checksum is computed by manipulating bits of the packet with a CRC algorithm which is common to the device 1 and the UUT 205.

Figure 4:
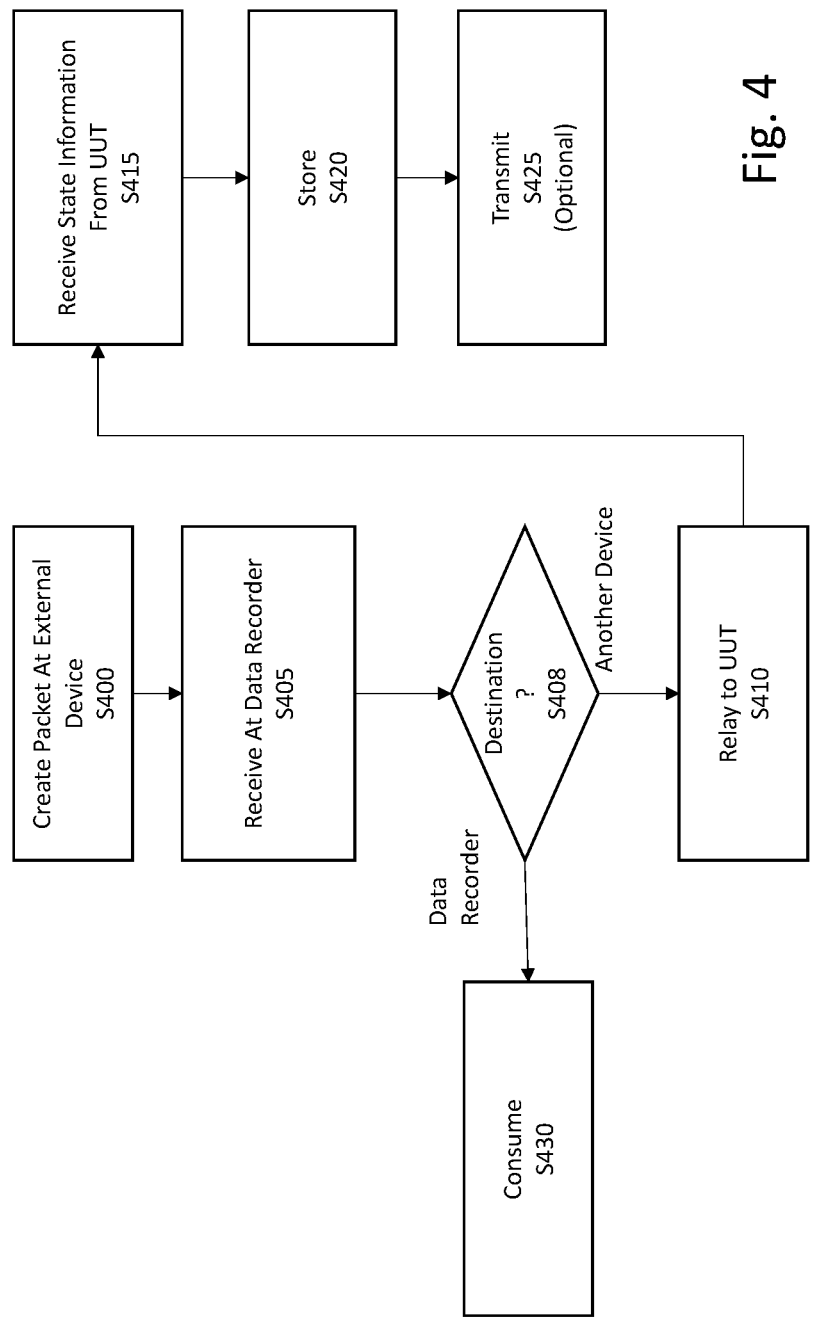
FIG. 4 is a flow chart for a method in accordance with aspects of the disclosure.

FIG. 4 is a flow chart for a method in accordance with aspects of the disclosure. The following description is made with respect to reading state information from one or more registers in the CPU in the UUT 205.

At S400, the first external device 200 creates the packet 300 for transmits. A user may refer to the distributed register set 220 to select one or more addresses of registers in the CPU in the UUT 205 to read state information. Since the distributed register set 220 includes the type of information or function associated with each register, the user may identify target register(s) of interest using the distributed register set 220. In the header 305, the first external device 200 may include the identifier of the CPU in the UUT 205. In the diagnostic/control 310, the first external device 200 may include the identifier associated with a read command (and/or setting up a diagnostics channel). The identifier may be different if the first external device 200 wants to receive only the instantaneous value of the state information (as opposed to each updated value). Note that the updated state information may be the same where there is no change to the state information for the update period.

In the high speed data stream, the first external device may include the address(es) of the registers obtained from the distributed register set 220 for the target registers. The packet 300 is transferred from the first external device 200 to the device 1. At S405, the device 1 receives the packet 300 from the first external device 200 via one of the CAN interface 108A or 108B or the USB 106. The FPGA 100 determines if the device 1 is the final destination for the packet 300 at S408. The determination is based on the identifier or address in the header 305 of the packet 300. If the device 1 is the final destination for the packet 300 ("data recorder" at S408), the device 1 consumes the high speed data stream at S430. When the final destination of the packet 300 is the device 1, the FPGA 100 in the device 1 may be reprogrammed or its registers read.

However, when the device 1 is not the final destination of the packet 300, the FPGA 100 relays the packet 300 to the UUT 205 (to the CPU). The FPGA 100 transfers the packet to the UUT 100 via the fiber optic cable connected to the SFP connector 104 at S410.

The UUT 205 receives the packet 300. When the identifier indicates setting up a diagnostics connection for one or more registers, the CPU in the UUT 205, transfers the state information for the requested register(s) every time the register is updated. In an aspect of the disclosure, the state information is updated each conversion (ADC conversion). Therefore, the CPU in the UUT 205 may transfer the state information to device 1 each conversion, e.g., conversion rate at S415. For example, when the conversion rate is 650 ns, the CPU transmits the state information to the device 1 every 650 ns. This assumes that the communication rate is faster than the conversion rate 650 ns. Where the communication rate is slower, the transmission is limited by the communication rate.

At S420, the device 1 (FPGA 100) may store the received state information for the register(s) in the internal memory 120. In an aspect of the disclosure, the received state information may include the address of the register in the CPU in the UUT 205.

When an oscilloscope 215 is connected to one or more output ports (BNC connectors) 110A-N of the device 1, the device 1 may transmit the received state information (from the CPU in the UUT 205) to the oscilloscope 215 for one or more registers (depending on the number of ports connected) at S425. In an aspect of the disclosure, the packet 300 may also specify which registers should be displayed on the oscilloscope 215 verses only internally stored. The received state information may respectively be converted into analog signal(s) via ADC conversion circuit 112A-N. In an aspect of the disclosure, when the oscilloscope 215 is not connected to the output ports (BNC connectors) 110A-N, and instead an external memory card is connected to micro SD connector 102, the FPGA 100 may cause the state information for the register(s) requested in packet 300 to be stored in the external memory card.

In other aspects of the disclosure, instead of reading state information from the registers in the CPU in the UUT 205, the first external device 200 may write control information and/or update firmware for the CPU, such as in an FPGA in the UUT 205 via the device 1. At S400, the first external device 200 may determine the relevant or target registers for the control information from the distributed register set 220. When a firmware update is needed, the first external device 200 may skip S200 as all of the registers may be updated. In the diagnostic/control 310, the first external device 200 may include the identifier associated with write or control. The high speed data stream 315 may include the addresses of the registers and the associated control information or firmware update. The address of the CPU in the UUT 205 may be included in the header 305. Similar to above, the FPGA 100 may determine if the device 1 is the final destination for the packet 300 at S410 using the address in the header 305. When the CPU in the UUT 205 is the final destination, the FPGA 100 relays the packet 300 to the CPU in the UUT 205. S415-S425 may be omitted when writing to the CPU in the UUT 205 (without a corresponding reading of registers).

Multiple packets 300 may be transmitted from the first external device 200 to write information or update firmware and/or read state information. In an aspect of the disclosure, one packet 300 may be used to write information and/or update firmware and another packet may be used to read state information from registers in response to the written information and/or update firmware.

In the above, the device 1 may act as a digital signal repeater.

Figure 5:
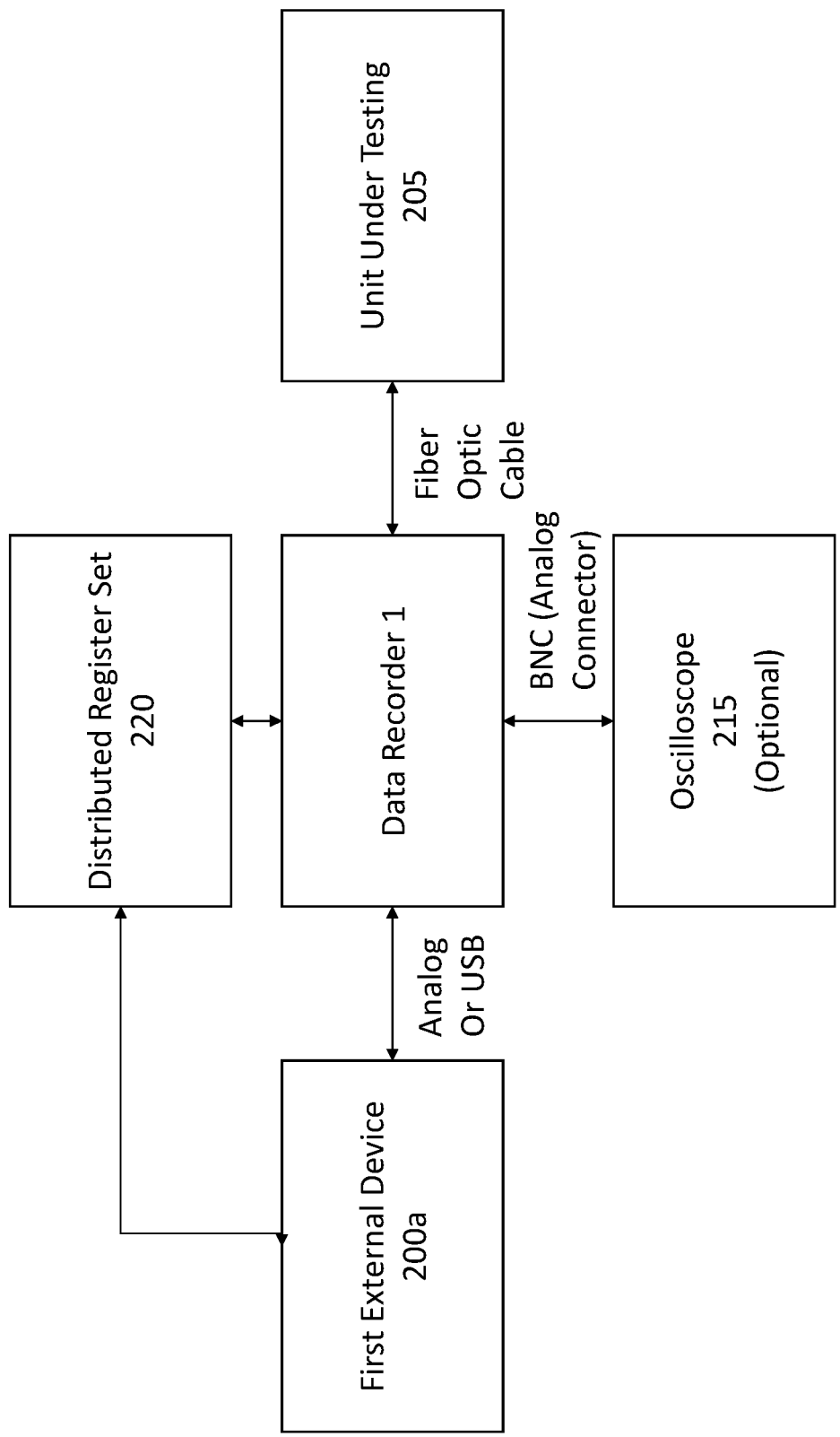
FIG. 5 is a diagram of another diagnostics and testing system in accordance with aspects of the disclosure for a unit under testing.

In other aspects of the disclosure, the first external device 200a may transmit an analog signal(s) (stimulus) to the device 1 (firmware data recorder). The device 1 transmits a corresponding digital signal(s) to the CPU in the UUT 205. FIG. 5 is a diagram of another diagnostics and testing system in accordance with aspects of the disclosure for a unit under testing 205 where the signal from the first external device 200a is an analog signal. In this aspect of the disclosure, the first external device 200a may be connected to the device 1 via analog input 114 or the USB connector 106.

The first external device 200*a* may be any of the external devices listed above. The first external device 200*a* may have a database containing one or more sets of analog inputs (stimulus) associated with registers and corresponding responsive state information for registers in the CPU in the UUT 205. In some aspects of the disclosure, since the identifier(s) of the register(s) may be included in the database, the first external device 200*a* may not check the distributed register set 220 for the target registers. In other aspect of the disclosure, the corresponding responsive state information for the registers in the CPU in the UUT 205 may be omitted from the database.

Each set of analog inputs (stimulus) may be previously obtained under certain known conditions (known application data). For example, for a vehicle, the known application data (set of analog inputs) may be determined from a reference driving route. The reference driving route may be a driving route used during the production of the vehicle or at an initial testing. The set of analog inputs (stimulus) may contain at least one of injected torque, current or voltage from the reference driving route and corresponding register addresses. The set is designed to simulate driving in the reference driving route and observe the state information in the registers of the CPU in the UUT 205 during the simulation. The corresponding responsive state information in the database may include the state information obtained when the driving route was actually driven, and the state information was recorded.

The database may include more than one reference driving routes and sets of analog inputs (and corresponding responsive state information).

In another aspect of the disclosure, instead of or in addition to the database, the first external device 200*a* may comprise a function generator. The function generator may be used to generate an analog signal (stimulus) to trigger a response in the CPU in the UUT 205 (change in state information). The analog signal may be used for stability analysis. For the function generator may generate step functions, swept sine wave, chirped signals or any of function used to excite the CPU in order to perform a frequency response analysis.

Figure 6:
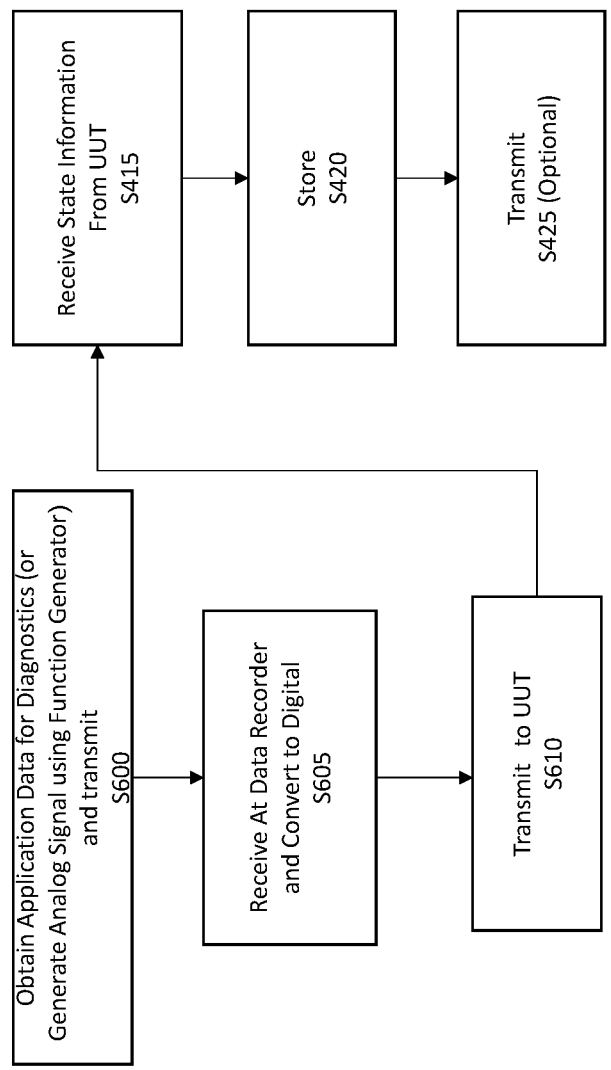
FIG. 6 is a flow chart for a method in accordance with aspects of the disclosure.

FIG. 6 is a flow chart for a method in accordance with aspects of the disclosure for writing control information to the register(s) in the CPU in the UUT 205 in accordance with aspects of the disclosure.

At S600, the first external device 200*a* either obtains one of the sets of analog inputs (stimulus) from the database or generates the analog inputs (stimulus) using an internal function generator. In an aspect of the disclosure, a user may select via a user interface one of the sets of the analog inputs (stimulus) from a list which may be displayed on a display of the first external device 200*a*. Once the one of the sets of analog inputs (stimulus) are selected, the first external device 200*a* may generate a packet 300 for transmission to the device 1. The packet 300 may include in the header 305, the identifier of the CPU in the UUT 205. In the diagnostic/control 310, an identifier indicating "control" or a write command may be used. The set of analog inputs (stimulus) and corresponding register addresses may be included in the high speed data stream 315. A second packet 300 may also be generated for reading the responsive state information from the registers in the CPU in the UUT 205. The second packet 300 may include in the header 305, the identifier of the CPU in the UUT 205. In the diagnostic/control 310, an identifier indicating read command or diagnostics may be used. The high speed data stream 315 may include the addresses of the registers.

After the packets 300 are generated, the first external device 200*a* may transmit the packets 300 to the device via the analog input 114 or USB connector 106.

In other aspects of the disclosure, at S600, the internal function generator in the first external device 200*a* may generate the analog signal(s) (stimulus). A user may refer to the distributed register set 220 to select one or more addresses of registers in the CPU in the UUT 205 to read state information responsive to the generated analog signal(s)(stimulus). Since the distributed register set 220 include the type of information or state information associated with each register, the user may identify the target register(s) of interest using the distributed register set 220. Similar to above, the first external device 200*a* may generate two packets: one to write to the registers of the CPU in the UUT 205 and one to read the registers of the CPU in the UUT 205.

The packet 300 may include in the header 305, the identifier of the CPU in the UUT 205. In the diagnostic/control 310, an identifier indicating "control" or a write command may be used. The generated analog signal and corresponding register addresses may be included in the high speed data stream 315. A second packet 300 may also be generated for reading the responsive state information from the registers in the CPU in the UUT 205. The second packet 300 may include in the header 305, the identifier of the CPU_in the UUT 205. In the diagnostic/control 310, an identifier indicating read command or diagnostics may be used. The high speed data stream 315 may include the addresses of the registers obtained from the distributed register set 220.

At S605, the packet(s) are received by the device 1 (data recorder). The analog information in the high speed data stream 315 is converted into a digital signal(s) using the ADC circuitry 116 (the first packet). The FPGA 100 confirms that the final destination of the packet is the CPU in the UUT 205.

At S610, the FPGA 100 may generate another packet for transmission to the CPU in the UUT 205. In the header 305, the identifier of the CPU in the UUT 205 may be included. In the diagnostic/control 310, an identifier indicating "control" or a write command may be used for the packet for writing to the CPU. In the high speed data stream 315, the CPU may include the digital stimulus (corresponding to the analog signals) and corresponding register addresses. Since the second packet may only have digital information, the second packet may be relayed without analog-to-digital conversion if the final destination is the CPU in the UUT 205. The FPGA 100 may transmit both packets 300 to the CPU in the UUT 205 at S610.

When the CPU in the UUT 205 receives the first packet, it writes the values into the corresponding registers and executes functionality associated with the same. After the CPU in the UUT 205 receives the second packet, the CPU transmits the state information requested to the device 1. Similar to above, when the identifier in the diagnostic/control 310 indicates setting up a diagnostics connection for one or more registers, the CPU in the UUT 205, transmits the state information for the requested register(s) every time the register is updated. In an aspect of the disclosure, the state information is updated each conversion (ADC conversion). Therefore, the CPU in the UUT 205 may transfer the state information to device 1 each conversion, e.g., conversion rate.

At S420, the device 1 (FPGA 100) may store the received state information for the register(s) in the internal memory 120. In an aspect of the disclosure, the received state information may include the address of the register in the CPU in the UUT 205.

When an oscilloscope 215 is connected to one or more output ports (BNC connectors) 110A-N of the device 1, the device 1 may transmit the received state information (from the CPU in the UUT 205) to the oscilloscope 215 for one or more registers (depending on the number of ports connected) at S425. Before transmitting, the received state information is converted into an analog signal(s) using the digital-to-analog conversion circuitry 112A-112N (for each requested register).

In an aspect of the disclosure, the user may compare the state information displayed on the oscilloscope 215 with the state information for the reference in the database (for the selected set). When there is a difference (greater than a threshold), the user may determine that there may be a problem with the CPU in the UUT 205.

Figure 7:
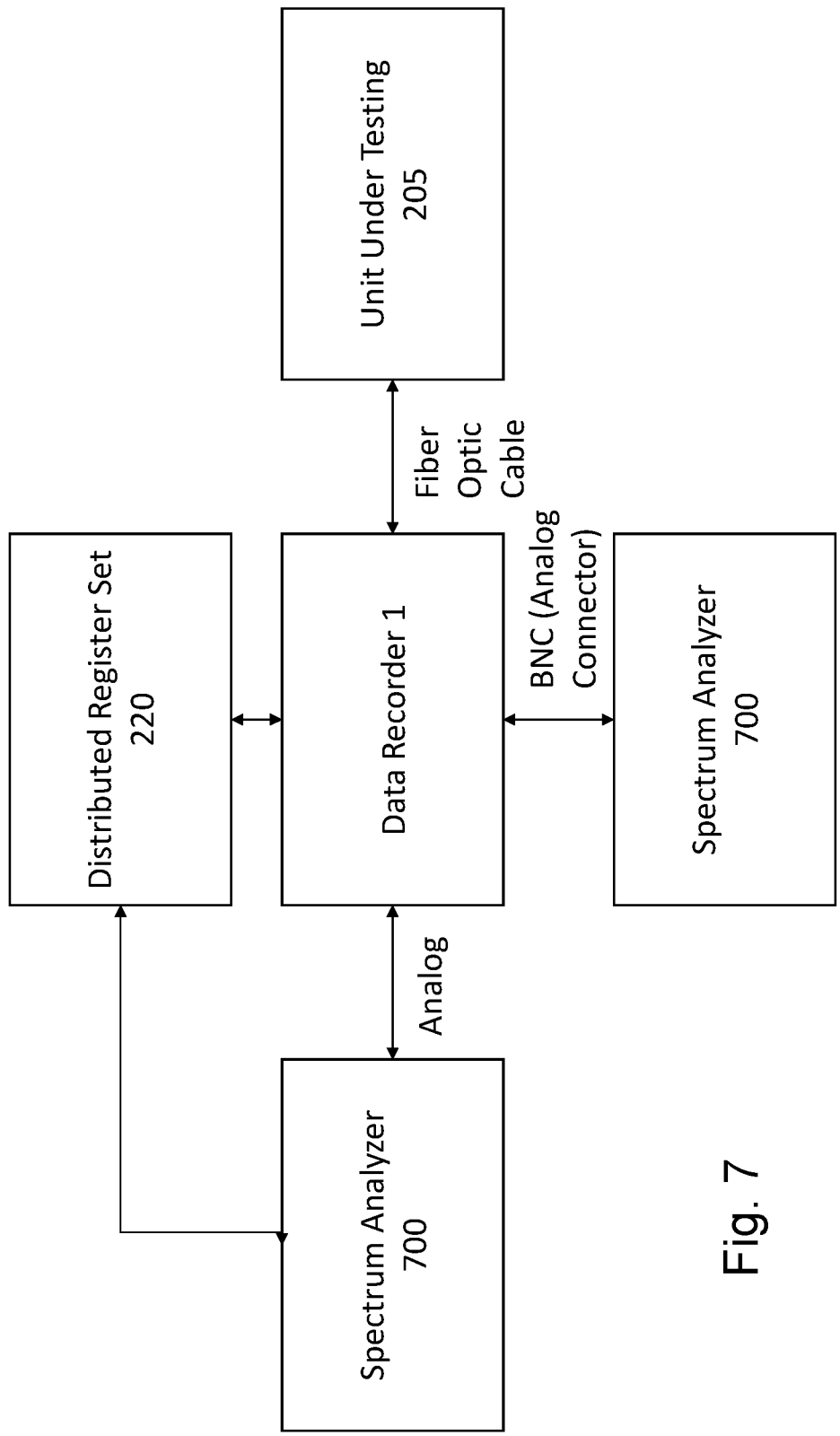
FIG. 7 is a diagram of another diagnostics and testing system in accordance with aspects of the disclosure for a unit under testing.

In another aspect of the disclosure, a spectrum analyzer 700 may be used to generate the analog signal(s). FIG. 7 is a diagram of another diagnostic and testing system in accordance with aspects of the disclosure for a unit under testing 205 with a spectrum analyzer 700. The spectrum analyzer 700 may be connected to the analog input 114. The spectrum analyzer 700 may also be connected to the analog outputs 110A-N (BNC connectors). In this aspect of the disclosure, the spectrum analyzer 700 may be used to generate the input analog signals (stimulus) and display the state information associated with one or more registers that is responsive to the input analog signals (stimulus).

Figure 8:
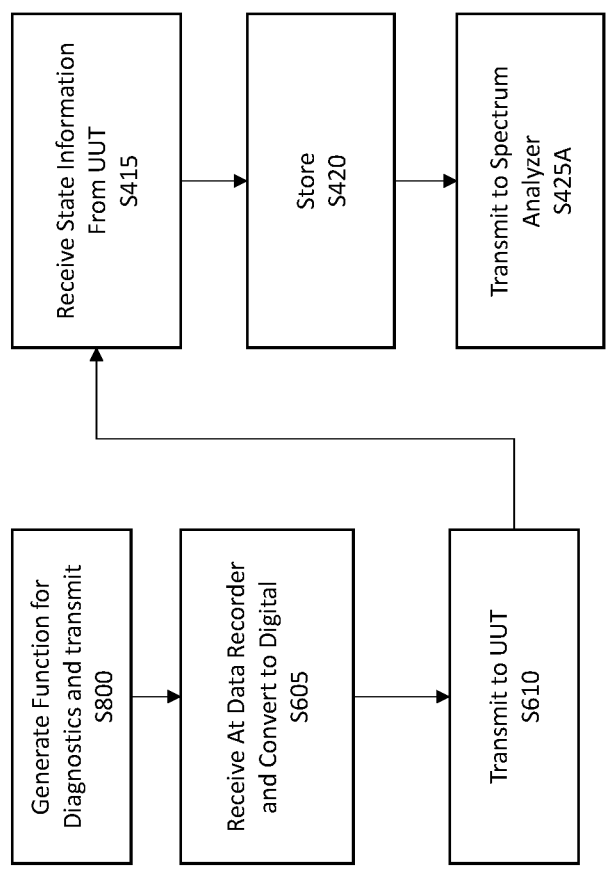
FIG. 8 is a flow chart for a method in accordance with aspects of the disclosure.

The input analog signals (stimulus) may be used for generating Bode plots, Nyquist plots and stability analysis. FIG. 8 is a flow chart for a method in accordance with aspects of the disclosure.

At S800, the spectrum analyzer 700 may generate the analog signals (stimulus). The analog signals (stimulus) may be a voltage or current (at different frequencies). The spectrum analyzer 700 may generate a packet 300 in a similar manner as described above. The header 305 may include the identifier of the CPU in the UUT 205. The diagnostic/control 310, may include an identifier indicating "control" or a write command. The high speed data stream 315 may include the analog signals (stimulus). Additionally, the user of the spectrum analyzer 700 may look at the distributed register set 220 to obtain the target register addresses for writing (applying the stimulus). The high speed data stream 310 may also include the target register addresses for the analog signals (stimulus).

The spectrum analyzer 700 may transmit the packet 300 at S800 to the device 1. In an aspect of the disclosure, another device may issue an instruction to the UUT 205 to enter a test mode. In the test mode, the UUT 205 may accept input from the spectrum analyzer 700 via the device 1. Similar to above, the spectrum analyzer 700 may also generate a second packet 300 for reading the state information responsive to the analog signals (stimulus). The second packet 300 may include in the header 305, the identifier of the CPU in the UUT 205. In the diagnostic/control 310, an identifier indicating read command or diagnostics may be used. The high speed data stream 315 may include the addresses of the registers obtained from the distributed register set 220.

At S605, the packet(s) 300 are received by the device 1 (data recorder). The analog signals (stimulus) in the high speed data stream 315 is converted into a digital stimulus using the ADC circuitry 116 (the first packet). The FPGA 100 confirms that the final destination of the packet is the CPU_in the UUT 205.

At S610, the FPGA 100 may generate another packet for transmission to the CPU in the UUT 205. In the header 305, the identifier of the CPU in the UUT 205 may be included. In the diagnostic/control 310, an identifier indicating "control" or a write command may be used for the packet for writing to the CPU in the UUT 205. In the high speed data stream 315, the CPU may include the digital stimulus (corresponding to the analog signals) and corresponding register addresses. The second packet is relayed to the CPU in the UUT 205 without conversion and the first packet is transmitted after conversion to the CPU in the UUT 205 at S610.

When the CPU in the UUT 205 receives the first packet, it writes the values into the corresponding registers and executes functionality associated with the digital stimulus. After the CPU in the UUT 205 receives the second packet, the CPU transmits the state information requested to the device 1. Similar to above, when the identifier in the diagnostic/control 310 indicates setting up a diagnostics connection for one or more registers, the CPU in the UUT 205, transmits the state information for the requested register(s) every time the register is updated. In an aspect of the disclosure, the state information is updated each conversion (ADC conversion). Therefore, the CPU in the UUT 205 may transfer the state information to device 1 each conversion, e.g., conversion rate.

At S420, the device 1 (FPGA 100) may store the received state information for the register(s) in the internal memory 120. In an aspect of the disclosure, the received state information may include the address of the register in the CPU in the UUT 205.

At S425A, the received state information is converted into an analog signal(s) using the digital-to-analog conversion circuitry 112A-112N (for each requested register). The device 1 transmits the analog signals to the spectrum analyzer 700 via the output (BNC connectors) 110A-110N, respectively. The analog signals may be displayed on the spectrum analyzer 700 (identified by register) for further analysis.

The figures show a single FPGA 100 in the device 1. However, in other aspects, multiple FPGAs may be used to achieve the functions, features or instructions described herein. The FPGA 100 is an example of a processor. However, as noted above, the disclosure is not limited to using an FPGA as the processor and other hardware elements may be used as the processor.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. An apparatus comprising:
    a small-form factor connector configured to receive a fiber optic cable, the apparatus being connectable to a unit under testing (UUT) via the fiber optic cable;
    a control area network (CAN) interface or a universal serial bus (USB) interface, the apparatus being connectable to an external device via at least one of the CAN interface or USB interface; and
    a processor configured to:
    receive a plurality of register addresses for registers in a central processing unit in the UUT from the external device via at least one of the CAN interface or USB interface to set up a reading of the corresponding registers in the central processing unit;

relay the plurality of register addresses to the central processing unit via the fiber optic cable; and receive state information corresponding to each of the plurality of register addresses periodically, wherein the period is less than or equal to an analog to digital conversion of an analog to digital converter (ADC) in the UUT.

2. The apparatus of claim 1, further comprising:
a plurality of digital-to analog converters (DACs) coupled to the processor; and
a plurality of analog output interfaces, one analog output interface being connected to a corresponding one of the plurality of DACs, respectively, wherein the plurality of analog output interfaces is configured to be connectable to a second external device.

3. The apparatus of claim 2, wherein the processor is configured to cause the state information corresponding to at least a subset of the plurality of register addresses to be output to the second external device via the plurality of analog output interface in response to receipt of the subset of the plurality of register addresses from the external device.

4. The apparatus of claim 1, wherein the processor is configured to receive firmware update for the UUT from the external device via at least one of the CAN interface or USB interface, the firmware update associated with one or more register addresses and, the processor is configured to relay the firmware update to the UUT via the fiber optic cable to write the firmware update to the one or more registers addresses.

5. The apparatus of claim 1, wherein the processor is configured to receive a write command for one or more registers of the central processing unit from the external device via at least one of the CAN interface or USB interface, and the processor is configured to relay the write command to the UUT via the fiber optic cable to write to the one or more registers addresses.

6. The apparatus of claim 1, wherein the UUT is a power inverter.

7. The apparatus of claim 1, further comprising:
an input analog interface; and
an analog to digital converter (ADC), wherein the ADC is connected to the processor.

8. The apparatus of claim 7, wherein the input analog interface is configured to be connected with the external device and wherein the apparatus is configured to receive at least one target analog signal from the external device, convert the at least one target analog signal into at least one target digital signal and transmit the at least one target digital signal to the central processing unit via the fiber optic cable, wherein the at least one target analog signal is associated with one or more register addresses in the central processing unit.

9. The apparatus of claim 8, wherein the at least one target analog signal is obtained from known application data.

10. The apparatus of claim 9, wherein the known application data is a reference driving route and contains at least one of injected torque, current or voltage from the reference driving route and corresponding register addresses.

11. The apparatus of claim 8, wherein the at least one target analog signal is obtained from a function generator in the external device.

12. The apparatus of claim 11, wherein the external device is a spectrum analyzer, wherein the at least one target analog signal is a frequency spectrum for examining a frequency response or stability analysis.

13. The apparatus of claim 1, wherein the period is less than 650 ns.

14. The apparatus of claim 1, wherein the processor is configured to receive a packet from the external device, the plurality of register addresses for registers in the central processing unit are contained in the packet, wherein the packet further comprises a header, and wherein the processor determines to relay the plurality of register addresses by examining a destination in the header.

15. The apparatus of claim 1, wherein the processor is a field programmable gate array (FPGA) with a gigabit interface.

16. The apparatus of claim 1, further comprising memory card connector, wherein the apparatus is configured to transmit the state information to a memory card connected to the memory card connector.

17. An apparatus comprising:
a small-form factor connector configured to receive a fiber optic cable, the apparatus being connectable to a unit under testing (UUT) via the fiber optic cable;
an input analog interface, the input analog interface is configured to connect with an external device;
an analog to digital converter (ADC); and
a processor connected to the ADC, wherein the apparatus is configured to receive at least one target analog signal from the external device via the input analog interface and convert the at least one target analog signal into at least one target digital signal, respectively, and
the processor is configured to transmit the target digital signal to a central processing unit in the UUT via the fiber optic cable, wherein the at least one target analog signal is associated with one or more register addresses in the central processing unit, wherein the processor is configured to periodically receive state information from the one or more register addresses, where the period is less than or equal to an analog to digital conversion of an analog to digital converter (ADC) in the UUT.

18. A diagnostic kit comprising:
a fiber optic cable; and
a mobile device comprising a housing having a small-form factor connector configured to receive the fiber optic cable, the fiber optic cable connectable to a port in a housing of a unit under testing (UUT), the housing further having a control area network (CAN) interface or a universal serial bus (USB) interface, the mobile device being connectable to an external device via at least one of the CAN interface or USB interface; the mobile device further comprising:
a processor configured to:
receive a plurality of register addresses for registers in a central processing unit in the UUT from the external device via at least one of the CAN interface or USB interface to set up a reading of the corresponding registers in the UUT;
relay the plurality of register addresses to the central processing unit via the fiber optic cable; and
receive state information corresponding to each of the plurality of register address periodically, wherein the period is less than or equal to an analog to digital conversion of an analog to digital converter (ADC) in the UUT.

* * * * *